(12) United States Patent
Mignot et al.

(10) Patent No.: US 11,075,161 B2
(45) Date of Patent: Jul. 27, 2021

(54) LARGE VIA BUFFER

(71) Applicant: INTERNATIONAL BUSINESS MACHINES CORPORATION, Armonk, NY (US)

(72) Inventors: Yann Mignot, Slingerlands, NY (US); Hsueh-Chung Chen, Cohoes, NY (US); Junli Wang, Slingerlands, NY (US); Chi-Chun Liu, Altamont, NY (US); Mary Claire Silvestre, Clifton Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/440,012

(22) Filed: Jun. 13, 2019

(65) Prior Publication Data
US 2020/0395293 A1 Dec. 17, 2020

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/76877* (2013.01); *H01L 23/53295* (2013.01)

(58) Field of Classification Search
CPC ........... H01L 21/76805; H01L 23/5226; H01L 23/53295; H01L 21/76811; H01L 21/76829; H01L 21/76885; H01L 21/76877; H01L 21/73802; H01L 21/76816; H01L 21/76837; H01L 21/76852; H01L 21/76834
See application file for complete search history.

(56) References Cited

U.S. PATENT DOCUMENTS

| | | | |
|---|---|---|---|
| 7,439,595 B2 | 10/2008 | Ueda | |
| 7,960,274 B2 | 6/2011 | Yang et al. | |
| 8,564,079 B2 | 10/2013 | Kang et al. | |
| 8,835,305 B2 | 9/2014 | Yang et al. | |
| 9,385,078 B1 | 7/2016 | Feurprier et al. | |
| 9,659,820 B2 | 5/2017 | Zhang et al. | |
| 9,805,977 B1 | 10/2017 | Sukumaran et al. | |
| 10,020,254 B1 | 7/2018 | Bao et al. | |

(Continued)

*Primary Examiner* — Jose R Diaz
(74) *Attorney, Agent, or Firm* — Cantor Colburn LLP; L. Jeffrey Kelly

(57) ABSTRACT

An interconnect structure is provided. The interconnect structure includes a first metallization layer, an insulating layer and a second metallization layer. The first metallization layer includes, at an uppermost surface thereof, a first body formed of first dielectric material, first metallic elements and buffer elements formed of second dielectric material adjacent the first metallic elements. The insulating layer is disposed on the uppermost surface of the first metallization layer and defines apertures located at the first metallic elements and the corresponding buffer elements. The second metallization layer is disposed on the insulating layer and includes a second body formed of first dielectric material and second metallic elements located at the apertures and extending through the apertures to contact the corresponding first metallic elements and the corresponding buffer elements.

10 Claims, 3 Drawing Sheets

(56) References Cited

U.S. PATENT DOCUMENTS

| | | |
|---|---|---|
| 10,038,025 B2 | 7/2018 | Huang et al. |
| 10,204,830 B2 | 2/2019 | Wallace et al. |
| 10,622,301 B2 | 4/2020 | Xu et al. |
| 2013/0001796 A1* | 1/2013 | Song ................ H01L 23/53295 257/774 |
| 2015/0001735 A1 | 1/2015 | Migot et al. |
| 2016/0336225 A1 | 11/2016 | Chen et al. |
| 2018/0061700 A1 | 3/2018 | Sun et al. |

* cited by examiner

LARGE VIA BUFFER

BACKGROUND

The present invention generally relates to fabrication methods and resulting structures for semiconductor devices. More specifically, the present invention relates to fabrication methods and resulting structures for large via buffers.

In contemporary semiconductor device fabrication processes, a large number of semiconductor devices and conductive interconnect layers are fabricated in and on a single wafer. The conductive interconnect layers serve as a network of pathways that transport signals throughout an integrated circuit (IC), thereby connecting circuit components of the IC into a functioning whole and to the outside world. Interconnect layers are themselves interconnected by a network of holes (or vias) formed through the wafer. As IC feature sizes continue to decrease, fabricating intricate structures of conductive interconnect layers and vias within an increasingly smaller wafer footprint is one of the most process-intensive and cost-sensitive portions of semiconductor IC fabrication.

SUMMARY

Embodiments of the present invention are directed to an interconnect structure. A non-limiting example of the interconnect structure includes a first metallization layer, an insulating layer and a second metallization layer. The first metallization layer includes, at an uppermost surface thereof, a first body formed of first dielectric material, first metallic elements and buffer elements formed of second dielectric material adjacent the first metallic elements. The insulating layer is disposed on the uppermost surface of the first metallization layer and defines apertures located at the first metallic elements and the corresponding buffer elements. The second metallization layer is disposed on the insulating layer and includes a second body formed of first dielectric material and second metallic elements located at the apertures and extending through the apertures to contact the corresponding first metallic elements and the corresponding buffer elements.

Embodiments of the present invention are directed to a method of fabricating an interconnect structure. A non-limiting example of the method includes forming a first metallization layer to include, at an uppermost surface thereof, a first body formed of first dielectric material, first metallic elements and buffer elements formed of second dielectric material adjacent the first metallic elements and disposing an insulating layer on the uppermost surface of the first metallization layer. The non-limiting example of the method further includes defining apertures in the insulating layer at locations of the first metallic elements and the corresponding buffer elements. In addition, the non-limiting example of the method includes disposing, on the insulating layer, a second metallization layer including a second body formed of first dielectric material and second metallic elements located at the apertures and extending through the apertures to contact the corresponding first metallic elements and the corresponding buffer elements.

Embodiments of the invention are directed to a method of fabricating an interconnect structure. A non-limiting example of the method includes assembling a stack of at least a first metallization layer and an insulating layer, etching the stack to expose uppermost portions of first metallic elements of the first metallization layer and surrounding the uppermost portions of the first metallic elements with buffer elements. The non-limiting example of the method further includes rebuilding etched portions of the insulating layer, forming a second metallization layer on the insulating layer and etching vias through the second metallization layer and the insulating layer to expose the first metallic elements and the buffer elements. In addition, the non-limiting example of the method includes filling the vias with conductive material to form second metallic elements in contact with the first metallic elements and the buffer elements.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
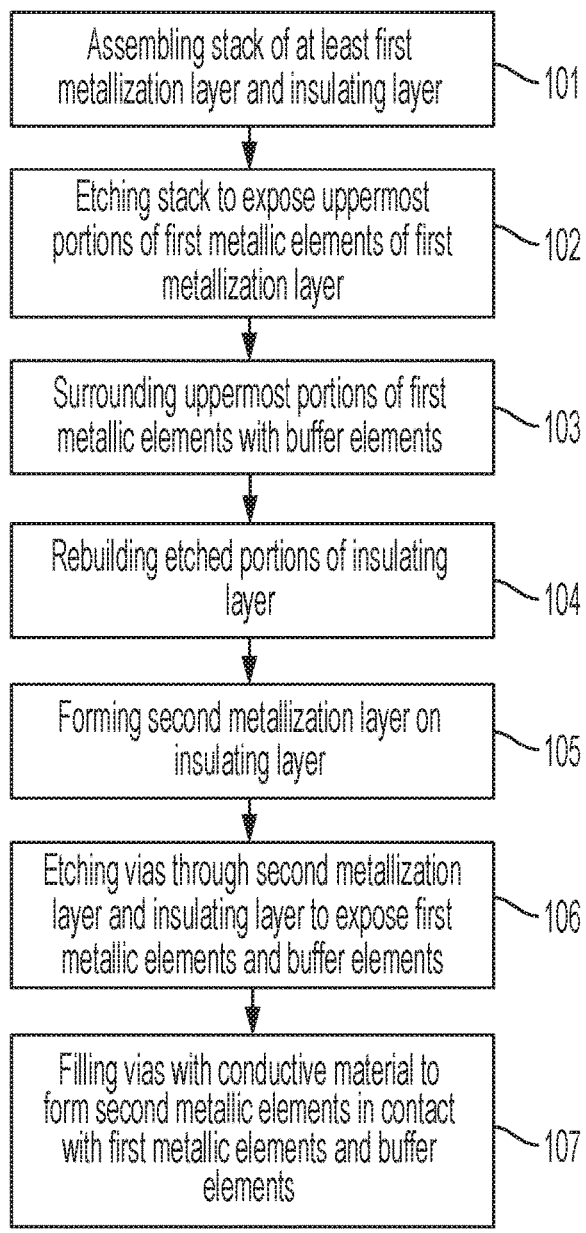
FIG. 1 is a flow diagram illustrating a method of forming self-aligned multi-metallic interconnects in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, back-end-of-line (BEOL) interconnects are typically created using dual damascene schemes for copper metallization with titanium nitride hard mask open processing to define trenches and to facilitate self-aligned via formation. In these or other cases, via resistance performance can be constrained by multiple parameters and, in particular, by a size of the via. That is, with a relatively large via, there is usually low characteristic resistance and degraded performance.

Often via sizes and other dimensions can be defined by via lithography and etch processing (e.g., reactive ion etch (ME) processing) that cannot be readily modified. The placement of a via, on the other hand, can be modified to "sit" on bottom metal. In these or other cases, if the via is too large, the via can be etched down during etch processing. This can create fangs and other undesired effects.

Turning now to an overview of the aspects of the invention, one or more embodiments of the invention address the above-described shortcomings of the prior art by providing for etch processing during which a bottom part of a via will be preserved to allow for a deeper etch on a metal side where an added buffer will reduce or avoid lateral etching and prevent possible shorts.

The above-described aspects of the invention address the shortcomings of the prior art by providing for an interconnect structure that enables a larger via area to land on metal below without etching side ULK, replacing the "area/zone targeted" with a more selective dielectric that can be used as a highly selective etch buffer, and improving via resistance with larger via contact area.

Turning now to a more detailed description of aspects of the present invention, FIG. 1 depicts a method of fabricating an interconnect structure. As shown in FIG. 1, the method includes at block 101 assembling a stack of at least a first metallization layer and an insulating layer, at block 102 etching the stack to expose uppermost portions of first metallic elements of the first metallization layer, and at block 103 surrounding the uppermost portions of the first metallic elements with buffer elements. The method further includes rebuilding etched portions of the insulating layer 104, forming a second metallization layer on the insulating layer 105, etching vias through the second metallization layer and the insulating layer to expose the first metallic elements and the buffer elements 106. In addition, the method includes filling the vias with conductive material to form second metallic elements in contact with the first metallic elements and the buffer elements 107.

In accordance with embodiments of the present invention, the method of FIG. 1 is executed such that respective surface areas of the second metallic elements are less than a combined surface area of the corresponding first metallic elements and the corresponding buffer elements, a material of the buffer elements differs from a dielectric material of the first and second metallization layers and the etching is selective to the dielectric material of the first and second metallization layers.

Figure 2:
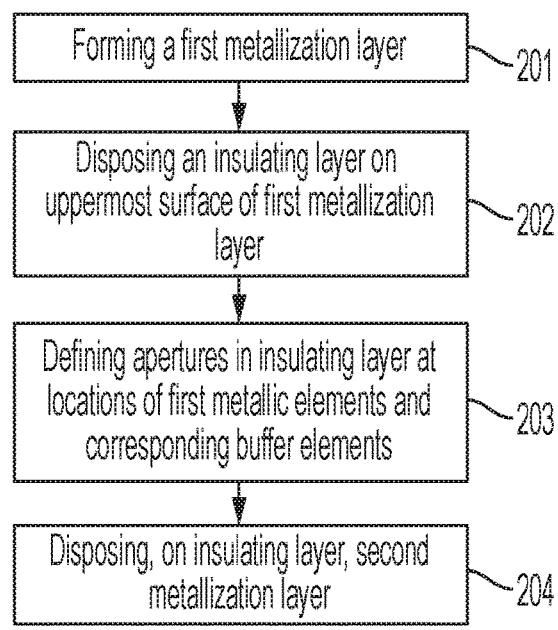
FIG. 2 is a flow diagram illustrating a method of forming self-aligned multi-metallic interconnects in accordance with embodiments of the present invention.

With reference to FIG. 2, another method of fabricating an interconnect structure is provided. As shown in FIG. 2, the method includes at block 201 forming a first metallization layer. The forming of the first metallization layer at block 201 is executed such that the first metallization layer includes, at an uppermost surface thereof, a first body formed of first dielectric material, first metallic elements and buffer elements formed of second dielectric material adjacent the first metallic elements. The method further includes at block 202 disposing an insulating layer on the uppermost surface of the first metallization layer, and at block 203 defining apertures in the insulating layer at locations of the first metallic elements and the corresponding buffer elements. In addition, the method includes disposing, on the insulating layer, a second metallization layer 204. The second metallization layer includes a second body formed of first dielectric material and second metallic elements located at the apertures and extending through the apertures to contact the corresponding first metallic elements and the corresponding buffer elements.

In accordance with embodiments of the present invention, the method of FIG. 2 is executed such that respective surface areas of the second metallic elements are less than a combined surface area of the corresponding first metallic elements and the corresponding buffer elements, the first metallization layer can include additional first metallic elements and the second metallization layer can include additional second metallic elements and each first metallic element is insulated from an adjacent first metallic element or an adjacent additional first metallic element by a buffer element or a combination of a buffer element and a corresponding portion of the first body. In addition, the insulating layer defines additional apertures through which the additional second metallic elements contact the corresponding first metallic elements and the corresponding additional first metallic elements and a pattern of the first metallic elements and the additional first metallic elements is distinct from a pattern of the second metallic elements and the additional second metallic elements. Also, one or more of the buffer elements surround uppermost portions of one or more first metallic elements.

In accordance with further embodiments of the present invention, the first dielectric material includes ultra low-k dielectric (ULK), the second dielectric material is different from the ULK and the insulating layer includes nitride (e.g., Nblock).

With reference to FIGS. 3-6, the method of fabricating the interconnect structure of FIGS. 1 and 2 will now be described in greater detail.

Figure 3:
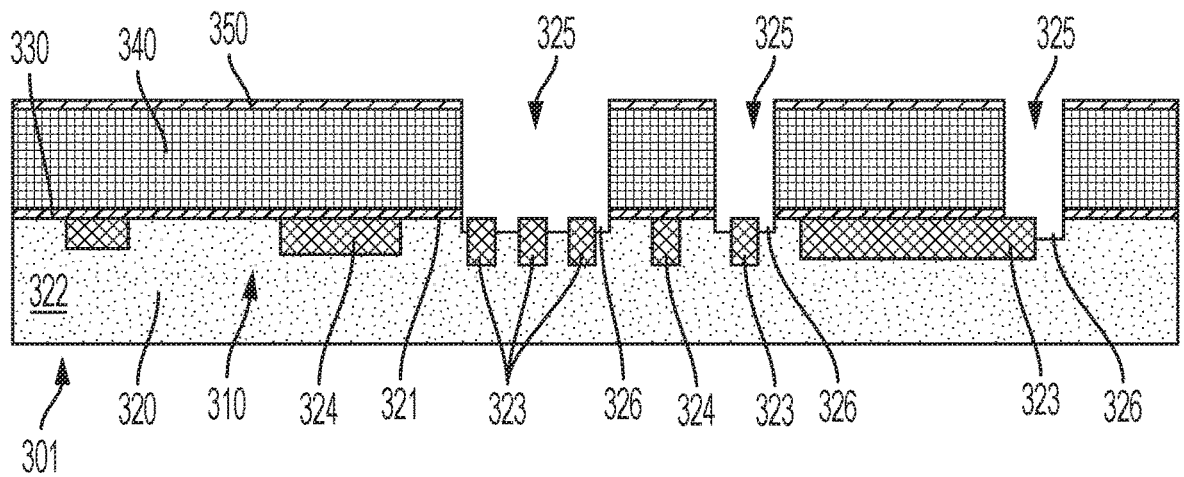
FIG. 3 depicts an initial structure of an interconnect structure to be assembled according to embodiments of the present invention.

With reference to FIG. 3, an initial structure 301 of an interconnect structure to be assembled according to embodiments of the present invention is provided and includes a stack 310 of at least a first metallization layer 320 and an insulating layer 330. The stack 310 can further include an organic planarization layer (OPL) 340 and silicon anti-reflective coating (SiARC) 350. The first metallization layer 320 has an uppermost surface 321 and includes, at the uppermost surface 321, a first body 322, first metallic elements 323 and additional first metallic elements 324. The first body 322 is formed of a first dielectric material, such as ULK, and is supportively disposed about the first metallic elements 323 and the additional first metallic elements 324. The first metallic elements 323 and the additional first metallic elements 324 are formed of a conductive material, such as copper, and are dispersed along at least the uppermost surface 321 with a first pattern. The insulating layer 330 can include nitride (i.e., Nblock) and is disposed on the uppermost surface 321. The OPL 340 is disposed on the insulating layer 321 and the SiARC 350 is disposed on the OPL.

It will be noted that the SiARC 350 is generally removed while opening the insulating layer 330 and that a partial etch of the first dielectric material of the first body 322 forms buffer element spaces 326 as discussed below.

In accordance with embodiments, an etch process can be executed such that respective portions of the SiARC 350, the OPL 340, the insulating layer 330 and the first body 322 at the uppermost surface are removed to expose uppermost portions of the first metallic elements 323 but not the additional first metallic elements 324, which remain covered by the insulating layer 330. The removal of the respective portions of the SiARC 350, the OPL 340, the insulating layer 330 result in the formation of trenches 325. The removal of the respective portions of the first body 322 at the uppermost surface result in the formation of buffer element spaces 326 at the bottoms of the trenches 325. The buffer element spaces 326 are adjacent to or disposed to surround the uppermost portions of the first metallic elements 323.

Figure 4:
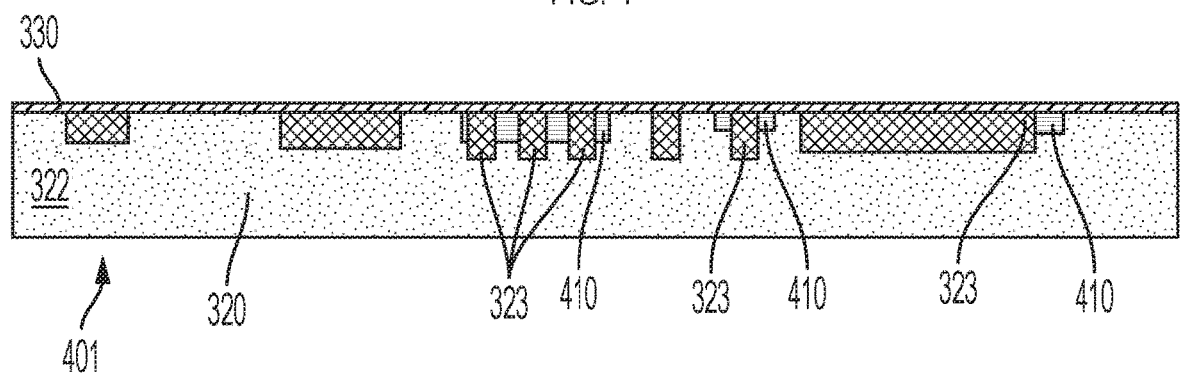
FIG. 4 depicts an early stage intermediate structure of the interconnect structure to be assembled according to the embodiments of the present invention.

FIG. 4 depicts an early stage intermediate structure 401 of the interconnect structure to be assembled according to the embodiments of the present invention. The early stage intermediate structure 401 results from a stripping away of the SiARC 350 and the OPL 340 and a cleaning process, as well as refill with an insulating layer re-deposition and chemical mechanical polishing (CMP) processes executed with respect to the initial structure 301 of FIG. 3. The stripping away of the SiARC 350 and the OPL 340 can be done in-situ during the buffer element spaces 326 formation processes or subsequently ex-situ. Before the refill process, a wet clean is performed to clean the wafer by removing all etch by-products. The refill process includes a filling of the buffer element spaces 326, remaining portions of the trenches 325 and a space over the insulating layer 330 with a second dielectric material. The second dielectric material differs from the first dielectric material and forms buffer elements 410 within the buffer element spaces 326.

The CMP serves to remove the second dielectric material that is present but does not form the buffer elements 410. The re-deposition of the insulating layer serves to reform the insulating layer 330 as a solid, unitary feature that extends across an entirety of the first metallization layer 320 (i.e., the first body 322 and the first metallic elements 323) and the buffer elements 410.

Figure 5:
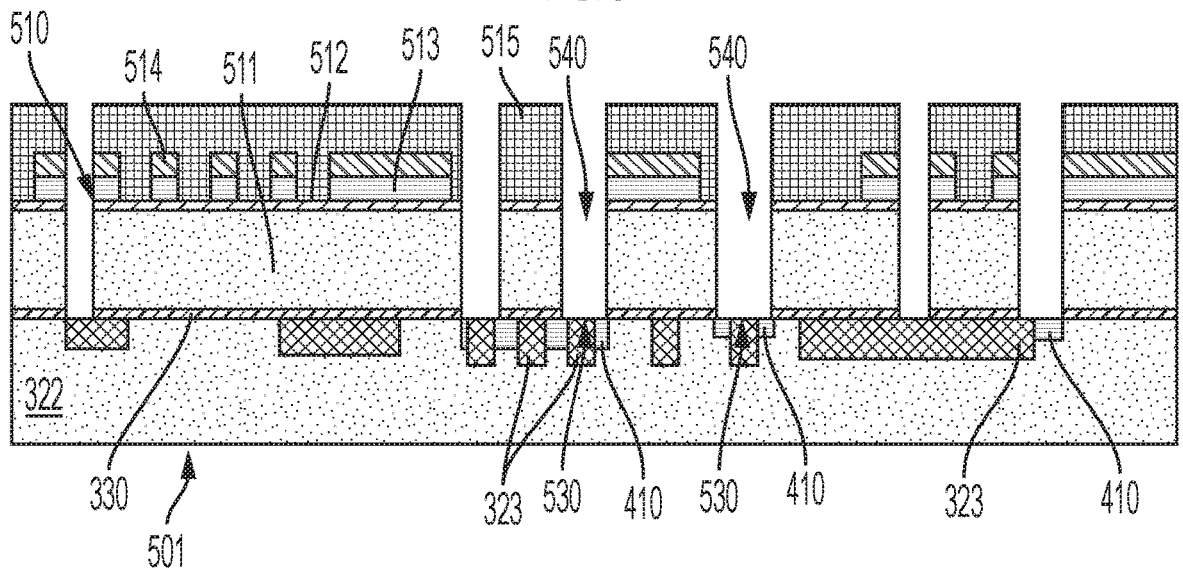
FIG. 5 depicts a late stage intermediate structure of the interconnect structure to be assembled according to the embodiments of the present invention.

FIG. 5 depicts a late stage intermediate structure 501 of the interconnect structure to be assembled according to the embodiments of the present invention. The late stage intermediate structure 501 results from a formation of a second layer 510 as well as lithographic and etch processes executed with respect to the early stage intermediate structure of FIG. 4. The second layer 510 includes a second body 511, a nitride layer 512, a metal hardmask layer 513, such as a layer of titanium nitride, a tetraethyl orthosilicate (TEOS) layer 514 and OPL 515. The second body 511 can be formed of the first dielectric material or a dielectric material that is similar to the first dielectric material and is, in any case, different from the second dielectric material. An etch process removes respective portions of several layers including the OPL 515, the nitride layer 512, the second body 511 and portions of the insulating layer 330 to form via 540 and to form apertures 530.

Because the etch processes of FIG. 5 are more selective to the materials of the buffer elements 410, longer overetch of the dielectric material of the second body 511 can be performed without etching into and through the materials of the buffer elements 410. As such, the first metallic elements 323 are completely preserved without the risk of short circuits being formed and combined widths of the first metallic elements 323 and the corresponding buffer elements 410 are wider than the trenches 540 and the apertures 530.

Figure 6:
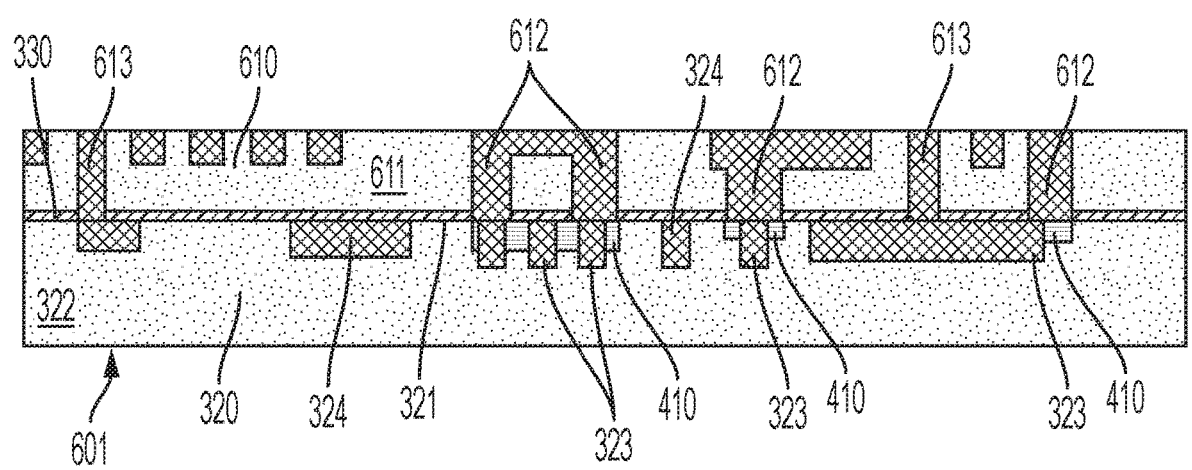
FIG. 6 depicts the interconnect structure assembled according to the embodiments of the present invention.

FIG. 6 depicts the interconnect structure 601 to be assembled according to the embodiments of the present invention. The interconnect structure 601 results from OPL 515 stripping and trench etching processes as well as filling and CMP processes being executed with respect to the late stage intermediate structure 501 of FIG. 5. As shown in FIG. 6, the interconnect structure 601 includes the first metallization layer 320, a remainder of the insulating layer 330 and a second metallization layer 610. The first metallization layer 320 includes, at the uppermost surface 321, the first body 322 formed of the first dielectric material (e.g., ULK), the first metallic elements 323 and the buffer elements 410 formed of the second dielectric material adjacent the first metallic elements 323. The buffer elements 410 can, in some but not all cases, surround uppermost portions of the first metallic element 323 and are formed of the second dielectric material, which differs from the first dielectric material. The remainder of the insulating layer 330 includes nitride (e.g., Nblock) and is disposed on the uppermost surface 321 and defines the apertures 530 (see FIG. 5) as being located at the first metallic elements 323 and the corresponding buffer elements 410. The second metallization layer 610 is disposed on the remainder of the insulating layer 330. The second metallization layer 610 and includes a second body 611, which is formed of the first dielectric material (or dielectric material which is similar to the first dielectric material is, in any case, different from the second dielectric material) and second metallic elements 612. The second metallic elements 612 are located at the apertures 530 and extend through the apertures 530 to contact the corresponding first metallic elements 323 and the corresponding buffer elements 410.

In accordance with embodiments of the present invention, respective widths and surface areas of the second metallic elements 612 are less than a combined surface area of the corresponding first metallic elements 323 and the corresponding buffer elements 410. Also, the first metallization layer 320 can include the additional first metallic elements 324 and the second metallization layer 610 can include additional second metallic elements 613. Here, each first metallic element 323 is insulated from an adjacent first metallic element 323 or an adjacent additional first metallic element 324 by a buffer element 410 or a combination of a buffer element 410 and a corresponding portion of the first body 322 and the remainder of the insulating layer 330 can be formed to define additional apertures 531 through which the additional second metallic elements 613 contact the corresponding first metallic elements 323 and the corresponding additional first metallic elements 324. Also, a pattern of the first metallic elements 323 and the additional first metallic elements 324 can be distinct from a pattern of the second metallic elements 612 and the additional second metallic elements 613.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an interconnect structure, the method comprising:
    assembling a stack of at least an insulating layer and a first metallization layer having an uppermost surface and comprising, at the uppermost surface, a first body formed of first dielectric material and first metallic elements, the insulating layer being disposed on the uppermost surface;
    etching the stack to form trenches to expose uppermost portions of the first metallic elements of the first metallization layer, the etching comprising removing respective portions of the insulating layer and the first body to form buffer element spaces surrounding the uppermost portions of the first metallic elements at bottoms of the trenches;
    surrounding the uppermost portions of the first metallic elements with buffer elements by filling the buffer element spaces with second dielectric material;
    rebuilding etched portions of the insulating layer over the buffer elements and the first metallic elements such that an entirety of the insulting layer is planar and portions thereof directly contact uppermost edges of the buffer elements and the first metallic elements;
    forming a second metallization layer on the insulating layer;
    etching vias through the second metallization layer and the insulating layer to the buffer elements and the first metallic elements to expose the first metallic elements and the buffer elements; and
    filling the vias with conductive material to form second metallic elements in contact with the first metallic elements and the buffer elements.

2. The method according to claim 1, wherein respective surface areas of the second metallic elements are less than a combined surface area of the corresponding first metallic elements and the corresponding buffer elements.

3. The method according to claim 1, wherein the second dielectric material differs from the first dielectric material and a dielectric material of the second metallization layers.

4. The method according to claim 3, wherein the etching is selective to the first dielectric material and the dielectric material of the second metallization layers.

5. The method according to claim 1, wherein the removing of the respective portions of the insulating layer and the first body to form the buffer element spaces comprises recessing the buffer element spaces into the first body from the uppermost surface along respective lengths of the uppermost portions of the first metallic elements.

6. The method according to claim 5, wherein the uppermost edges of the first metallic elements and the uppermost edges of the buffer elements are coplanar with the uppermost surface.

7. A method of fabricating an interconnect structure, the method comprising:
    providing a first metallization layer comprising a body having an uppermost surface and first metallic elements having uppermost edges coplanar with the uppermost surface;
    disposing an insulating layer on the uppermost surface;
    forming trenches in the insulating layer and the body to expose uppermost portions of the first metallic elements with buffer element spaces surrounding the uppermost portions at bottoms of the trenches;
    surrounding the uppermost portions with buffer elements by filling the buffer element spaces with dielectric material;
    rebuilding the insulating layer as a planar layer over and in direct contact with the buffer elements and the first metallic elements;
    etching vias through the insulating layer to the buffer elements and the first metallic elements to expose the first metallic elements and the buffer elements; and
    filling the vias with conductive material to form second metallic elements in contact with the first metallic elements and the buffer elements.

8. The method according to claim 1, wherein respective surface areas of the second metallic elements are less than a combined surface area of the corresponding first metallic elements and the corresponding buffer elements.

9. The method according to claim 1, wherein the buffer element spaces are recessed into the body from the uppermost surface along respective lengths of the uppermost portions of the first metallic elements.

10. The method according to claim 9, wherein uppermost edges of the first metallic elements and uppermost edges of the buffer elements are coplanar with the uppermost surface.

* * * * *